US010229748B1

(12) United States Patent
Gerhard et al.

(10) Patent No.: US 10,229,748 B1
(45) Date of Patent: Mar. 12, 2019

(54) MEMORY INTERFACE LATCH WITH INTEGRATED WRITE-THROUGH FUNCTION

(71) Applicant: International Business Machines Corporation, Armonk, NY (US)

(72) Inventors: Elizabeth L. Gerhard, Rochester, MN (US); Todd A. Christensen, Rochester, MN (US); Chad A. Adams, Byron, MN (US); Peter T. Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/823,635

(22) Filed: Nov. 28, 2017

(51) Int. Cl.
   *G11C 7/10* (2006.01)
   *G11C 29/38* (2006.01)
   *G11C 29/12* (2006.01)

(52) U.S. Cl.
   CPC .......... *G11C 29/38* (2013.01); *G11C 29/1201* (2013.01); *G11C 29/12015* (2013.01)

(58) Field of Classification Search
   CPC ............... G11C 29/38; G11C 29/1201; G11C 29/12015
   USPC ............................................ 365/189.02, 201
   See application file for complete search history.

(56) References Cited

U.S. PATENT DOCUMENTS

| 5,153,848 | A | 10/1992 | Elkind et al. |
| 6,281,708 | B1 * | 8/2001 | Kenny ............. H03K 19/01721 326/24 |
| 6,657,912 | B1 * | 12/2003 | Correale, Jr. ............ G11C 7/12 365/189.04 |
| 7,516,424 | B2 | 4/2009 | Barnfield et al. |
| 7,925,950 | B2 | 4/2011 | Christensen et al. |
| 9,223,916 | B2 | 12/2015 | DiLullo et al. |

(Continued)

FOREIGN PATENT DOCUMENTS

| EP | 0190494 A1 | 8/1986 |
| EP | 0875092 B1 | 5/2006 |

(Continued)

OTHER PUBLICATIONS

Babu et al., "An Advanced BIST Architecture with Low Power LBIST and BDS Oriented March Algorithm for Intra Word Coupling Faults", International Journal of Engineering and Computer Science, ISSN:2319-7242 vol. 4, Issue 1, Jan. 2015, p. 9809-9813.

(Continued)

*Primary Examiner* — Vu Le
(74) *Attorney, Agent, or Firm* — Stosch Sabo

(57) ABSTRACT

A memory interface latch including a data NAND gate and a feedback gate can be created within an integrated circuit (IC). When a feedback node is driven low, the data NAND gate can drive an inverted value of a memory array bitline input to a data output of the memory interface latch within a time of one gate delay. A feedback gate can, in a functional mode, during one phase of a clock signal, drive the feedback node high and during the other phase of the clock signal, drive the feedback node to a complement the data output. The feedback gate can be also, in an LBIST write-through mode, drive the feedback node to the value of a WRITE_DATA input. The feedback gate can be also, in a fence mode, drive the feedback node to fixed logic value.

18 Claims, 7 Drawing Sheets

(56) References Cited

U.S. PATENT DOCUMENTS

| | | | |
|---|---|---|---|
| 2004/0213050 A1* | 10/2004 | Fukuoka | G01R 31/31853 365/189.05 |
| 2005/0138509 A1 | 6/2005 | Kiryu et al. | |
| 2005/0138586 A1 | 6/2005 | Hoppe et al. | |
| 2007/0198237 A1 | 8/2007 | Barnfield et al. | |
| 2007/0290708 A1 | 12/2007 | Takatori | |
| 2008/0276144 A1 | 11/2008 | Huben et al. | |
| 2009/0271669 A1 | 10/2009 | Adams et al. | |
| 2009/0287971 A1 | 11/2009 | Adams et al. | |
| 2009/0323445 A1 | 12/2009 | Adams et al. | |
| 2010/0039149 A1 | 2/2010 | Swain et al. | |
| 2010/0218055 A1 | 8/2010 | Christensen et al. | |
| 2011/0068842 A1* | 3/2011 | Hoxey | G11C 7/106 327/199 |
| 2012/0139601 A1 | 6/2012 | Kim | |
| 2015/0207494 A1 | 7/2015 | Kim | |

FOREIGN PATENT DOCUMENTS

| | | |
|---|---|---|
| GB | 2456656 A | 7/2009 |
| GB | 2507001 A | 4/2014 |
| WO | 03025599 A1 | 3/2003 |
| WO | 2011119500 A1 | 9/2011 |
| WO | 2013107694 A1 | 7/2013 |
| WO | 2015094821 A1 | 6/2015 |

OTHER PUBLICATIONS

Glokler et al., "Enabling Large-Scale Pervasive Logic Verification through Multi-Algorithmic Formal Reasoning", FMCAD, vol. 6, 2006, pp. 1-8.

Kute et al., "Cross Coupled Digital NAND Gate Comparator Based Flash ADC", Communications and Signal Processing (ICCSP), International Conference on IEEE, 2015, pp. 1718-1721.

Gerhard et al., "Memory Interface Latch With Integrated Write-Through and Fence Functions", U.S. Appl. No. 15/823,640, filed Nov. 28, 2017.

IBM, List of IBM Patents or Patent Applications Treated as Related, Nov. 27, 2017, 2 pages.

\* cited by examiner

MEMORY INTERFACE LATCH WITH INTEGRATED WRITE-THROUGH FUNCTION

BACKGROUND

The present disclosure generally relates to integrated circuits (ICs). In particular, this disclosure relates to efficient test interfaces between a memory unit and a processor located on the same IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

Semiconductor memory devices can be used in computers and other electronic systems to store data electronically. For example, instructions for a processor circuit and data processed by the processor circuit can both be stored in a semiconductor memory device such as an IC memory array. Such memory devices may be fabricated using a variety of semiconductor technologies. The time to access all data locations within a semiconductor memory device is generally uniform, which can result in efficient storage and retrieval of data from any data location within the devices. Semiconductor memory devices can be "volatile" or "non-volatile" with regards to data retention during interruption of electrical power supplied to a chip. A volatile memory device can lose data when the power supplied to the device is interrupted, and a non-volatile device is designed to retain data during power supply interruptions.

SUMMARY

Embodiments may be directed towards a memory interface latch within an integrated circuit (IC). The memory interface latch can include a data NAND gate configured to drive, in response to at least one input selected from the group of inputs consisting of: a memory array bitline input and a feedback node being driven to a logic "0," a data complement (Q_N) output of the memory interface latch to a logic "1" within a time interval of one gate delay. The memory interface latch can also include a feedback gate coupled to the Q_N output and to the feedback node. The feedback gate can be configured to, in a functional mode initiated by receiving a de-asserted logic built-in self-test (LBIST) input signal, in response to a clock input signal of a first clock input state, drive the feedback node to a logic "1" and in response to a clock input signal of a complement of the first clock input state, drive the feedback node to a complement of a logic state of the Q_N output. The feedback gate can be also be configured to, in a write-through mode initiated by receiving an asserted LBIST input signal, drive the feedback node to a logic state corresponding to a logic state of a WRITE_DATA input. The feedback gate can be also be configured to, in a fence mode initiated by receiving an asserted FENCE input signal, drive the feedback node to fixed logic value.

Embodiments may also be directed towards a memory interface latch configured to drive, to a data complement (Q_N) output coupled to a processor circuit, through a data path that includes one gate delay, the complement of a data signal received from a memory array bitline. The memory interface latch can include a logic circuit having a first input coupled to the memory array bitline and an output coupled to the Q_N output. The memory interface latch can also include a feedback circuit coupled to a second input of the logic circuit through a feedback node. The feedback circuit can be further coupled to the output of the logic circuit at the Q_N output and the feedback circuit can be configured to, in response to receiving an asserted FENCE input signal, drive the feedback node to fixed logic value.

Embodiments may also be directed towards a design structure embodied on a non-transitory computer-readable storage medium readable by a machine used in design, manufacture, and simulation of an IC including a memory interface latch, the design structure comprising elements that, when processed in a semiconductor manufacturing facility, produce an IC. The IC can include a memory interface latch having a logic circuit having a first input coupled to the memory array bitline and an output coupled to the Q_N output. The memory interface latch can also include a feedback circuit coupled to a second input of the logic circuit through a feedback node. The feedback circuit can be further coupled to the output of the logic circuit at the Q_N output and the feedback circuit can be configured to, in response to receiving an asserted FENCE input signal, drive the feedback node to fixed logic value.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
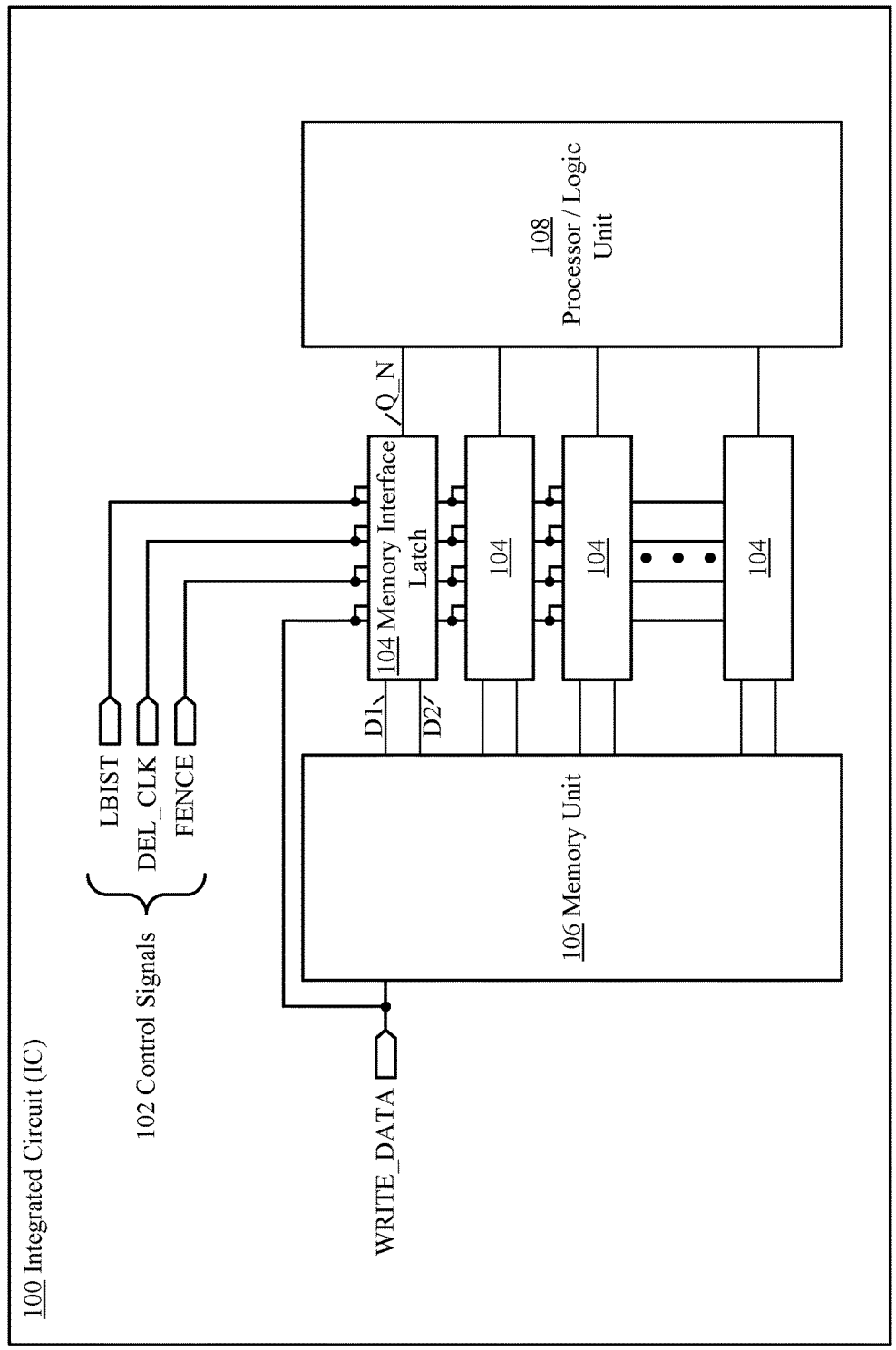
FIG. 1 is a block diagram depicting an integrated circuit (IC) including a memory interface latch, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing minimized memory access times to integrated circuits (ICs). Such ICs can include processors, logic, and special-purpose chips. Such minimized memory access times can result in enhanced IC performance and reduced electronic system cost.

Such ICs may be used to provide high-performance and high-reliability data processing capability for electronic devices including computing systems and servers. Such computing systems and servers may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing high-performance and high-reliability data processing capability to electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing high-performance and high-reliability data processing capability to consumer electronic devices such as cell phones, tablets, personal computers and Internet routing devices.

The number of transistors which can be fabricated on an IC die has increased exponentially throughout the long history of IC fabrication process development. As the number of transistors per die and overall IC complexity has increased, testing techniques and methodologies such as logic built-in self-test (LBIST) have been employed to overcome limitations of testing that relies solely on external automated test equipment.

LBIST is a form of built-in self-test (BIST) in which hardware and/or software is built into an IC that allows it to test its own functions, and therefore LBIST minimizes or eliminates reliance on external automated test equipment. The use of an LBIST testing methodology can require various hardware units, such as an LBIST controller, pseudo-random pattern generator (PRPG) and a multi-input signature register (MISR) to be designed into an IC. LBIST can offer numerous advantages over other IC testing methods, such as the ability to test internal circuits that have no direct connections to external IC pins, and that are thus unreachable by external automated test equipment. LBIST testing requires no control or interference of external automated test equipment, and can provide the ability to complete IC tests at high frequencies, thus reducing test time and cost.

Although LBIST can be extremely useful in testing on-chip logic circuits, LBIST is generally not used to test various on-chip memory elements such as static random-access memories (SRAMs), register files, content-addressable memories (CAMs), or enhanced dynamic random-access memory (EDRAM) macros. Unfortunately, logic circuits that are dependent on known or controlled outputs of a memory element or memory array can be very difficult to test using LBIST, as there may be no known logic state driven from the output of the memory element or array.

A possible solution to this problem can be to implement a memory interface latch that includes an LBIST "write-through" function. A write-through function can allow logic circuits interconnected to outputs of a memory element to receive known, controlled inputs in response to write data presented to memory unit inputs, in conjunction with LBIST control signal(s) received from an on-chip LBIST controller. One implementation of this memory interface latch can include a multiplexer (mux) within the read path of the memory device that allows, in response to the LBIST control signal, the write data to replace output data of the memory unit. While this solution can provide LBIST control over data received by logic circuits or a processor unit, the added data delay from the mux function can increase memory access time during a memory functional mode, which can correspondingly decrease overall IC clock frequency.

According to embodiments, a cross-coupled NAND memory interface latch can be designed to implement an LBIST write-through function without adding extra logic delay into the memory access path, i.e., the path for data transferred from the memory array/device outputs to processor inputs. A cross-coupled NAND (XCNAND) function can be altered so that while in an LBIST write-through mode, the write data inputs to the memory array are inserted onto the memory interface latch output through an internal latch feedback node. By placing the write data directly onto the feedback node of the cross-coupled NAND memory interface latch, the access time of the array is reduced, and the data is subsequently latched by the cross-coupled NAND once the LBIST write-through mode is turned off. The current memory interface latch implementation used for most designs achieves the same result by placing an additional mux after the cross-coupled NAND function. By removing this mux and performing the LBIST write-through directly at the cross-coupled NAND, delay equal to between one and two stages of logic can be removed from the memory device access time.

As cross-coupled NAND latches are commonly used by many memory elements to convert the dynamic memory cell data signals to static data signals, the base structure and controls for the modified memory interface latch circuit may already be in place within an IC design. Embodiments can therefore be used in current IC designs without requiring design and implementation of additional/new base structure and control signals. Some embodiments may only require the addition of six extra field-effect transistors (FETs), as the design of the present disclosure provides the LBIST write-through by driving the write data onto the pre-existing latch node.

Embodiments of the present disclosure depicted in the figures herein include transistors such as FETs, e.g., n-channel field-effect transistors (NFETs) and p-channel field-effect transistors (PFETs), however invention may be practiced in a variety of IC circuit technologies. For example, the FETs may be fabricated in planar complementary metal-oxide semiconductor (CMOS) technology, or in silicon on insulator (SOI) technology. Other types of suitable IC technologies may include, but are not limited to, SiGe, GaA and bipolar technologies.

Figure 2:
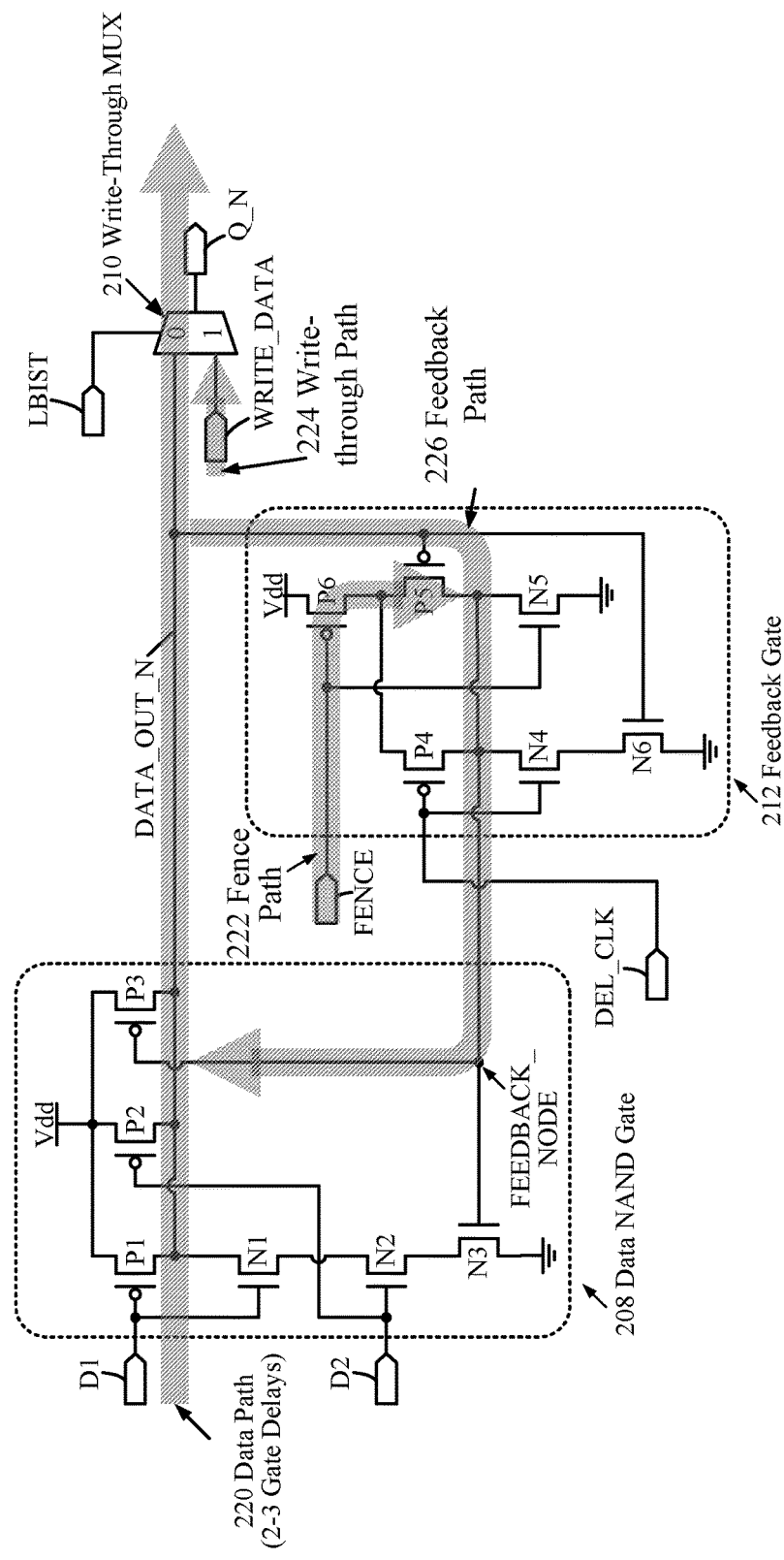
FIG. 2 is a schematic diagram depicting a memory interface latch with multiplexed logic built-in self-test (LBIST) write-through, according to embodiments consistent with the figures.
Figure 3:
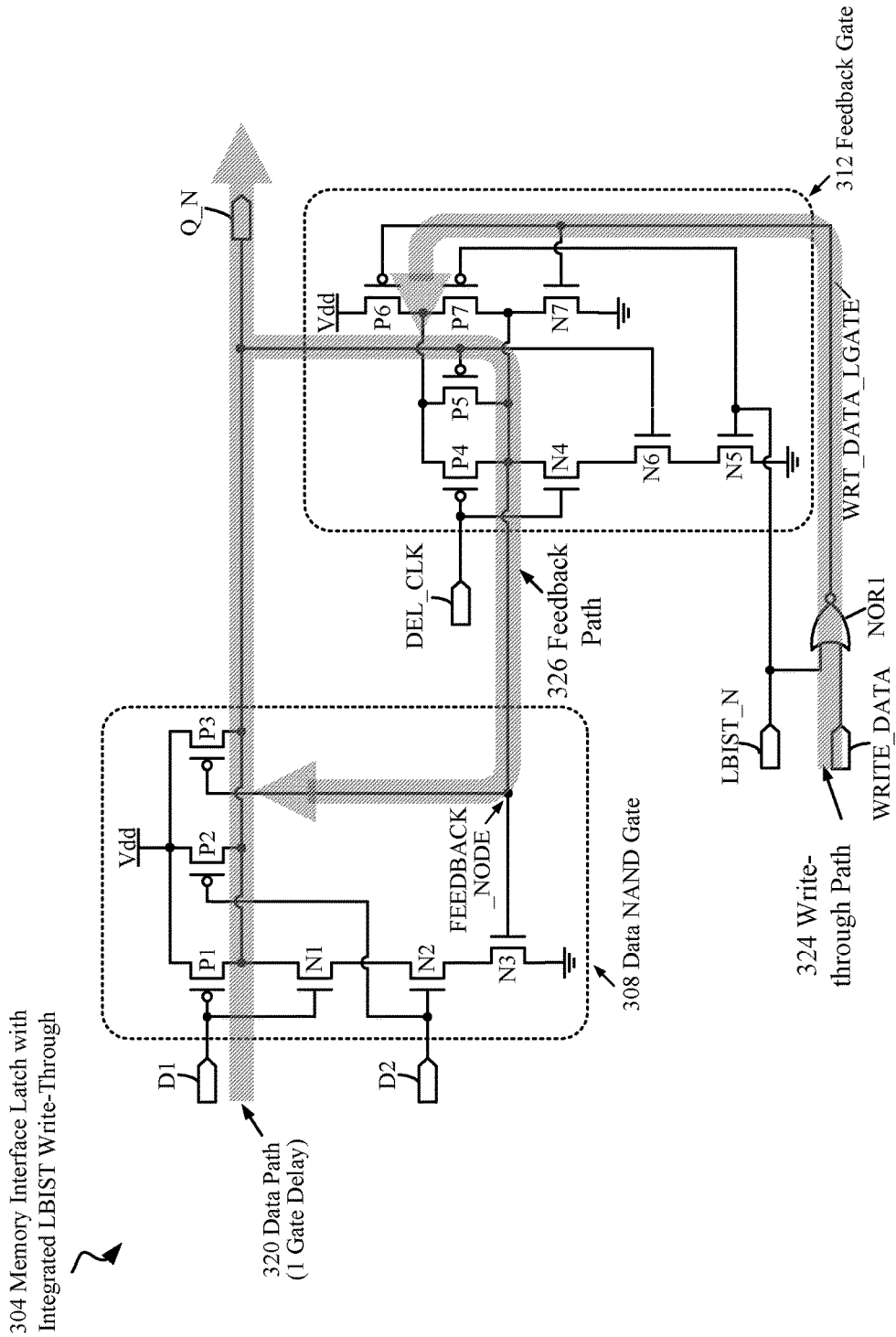
FIG. 3 is a schematic diagram depicting a memory interface latch with integrated LBIST write-through, according to embodiments consistent with the figures.
Figure 5:
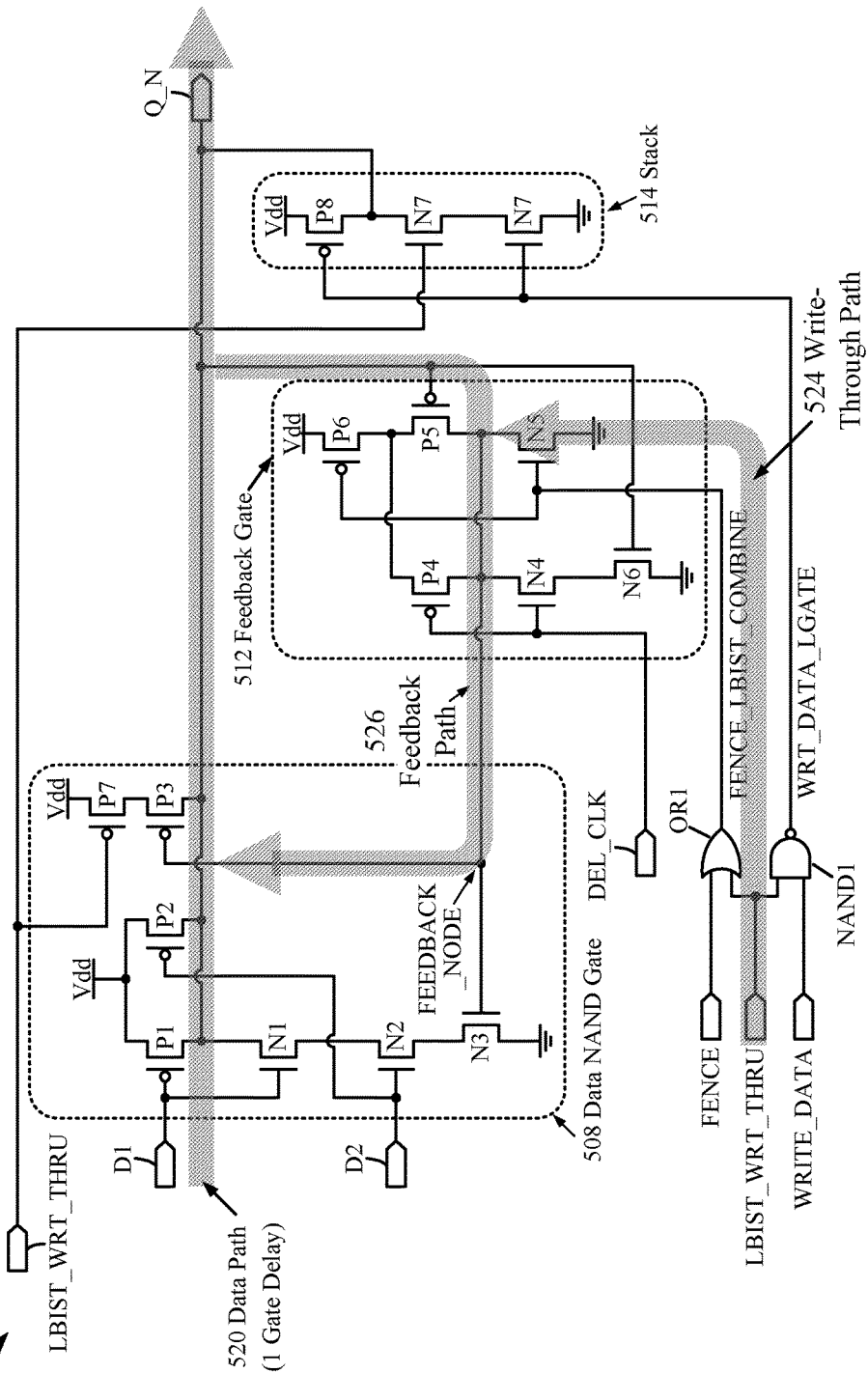
FIG. 5 is a schematic diagram depicting a memory interface latch with integrated LBIST write-through and internal fence, according to embodiments consistent with the figures.

FIG. 2, FIG. 3 and FIG. 5 each include schematic diagrams of memory interface latches having various features. Included within these figures are broad, lightly-shaded arrows depicting generalized "signal paths." For example, FIG. 2 includes data path 220, fence path 222, feedback path 226 and write-through path 224. The arrows depicting these generalized "paths" have been included within the figures to provide a general, visual understanding of signal propagation paths through the depicted circuitry. It can be understood that these broad, lightly-shaded arrows do not encompass each and every NFET, PFET or interconnecting wire within the schematics, but can rather serve to direct attention to the general propagation or flow of various signals through the circuitry.

For ease of illustration and discussion, a particular "asserted" or "active" logic state of various signals used to control the modes and/or test functions of a memory interface latch, e.g., "LBIST," "LBIST_N" or "FENCE," may be discussed and depicted. For example, an LBIST signal may be discussed as asserted or active at a logic "1" state, and de-asserted or inactive at a logic "0" state. In the example embodiments depicted in the figures and discussed in the associated text, particular control signal active states are used as examples. Such examples may be useful and appropriate in reference to certain applications of memory interface latches. However, these examples are not limiting; within the spirit and scope of the present disclosure, embodiments may make use of any combination of control signal active state polarities. It is understood by one of skill in the art of logic and/or circuit design that changing a particular control signal active state can often be accomplished through the addition of a single inverter.

Certain embodiments relate to memory interface latches that provide robust IC test capability in conjunction with decreased IC memory access times. FIG. 1 is a block diagram depicting an IC 100 including a memory interface latch 104 coupled to a memory unit 106 and to a processor/logic unit 108, according to embodiments of the present disclosure. FIG. 1 can be useful for providing an understanding of possible applications of embodiments within an IC 100. In embodiments, IC 100 can be, for example, a processor IC that includes one or more memory units 106 and one or more processors/logic units 108. IC 100 can include, for instance, multiple processor cores interconnected with multiple memory units 106, such as L1 cache units.

According to embodiments, memory unit 106 can include various on-chip memory elements or arrays such as SRAMs, register files, CAMs, or EDRAM macros. Memory unit 106 generally includes memory elements having dynamic global bitlines. Such global bitlines can be dynamically asserted, e.g., pulled down to a logic "0" value, in response to bit(s) stored within memory cells subjected to a read operation. In certain applications, an on-chip memory element or array may include two or more sections of memory, each section having a separate bitline used to read data from a respective portion of the memory element or array. In such applications, only one bitline is activated at any given time, while other bitline(s) are held in a precharged, e.g., logic "1" state. Embodiments can be useful in combining the two or more sections of memory through memory interface latch 104 without having to use additional gates.

According to embodiments, processor/logic unit 108 can include various types of processor cores and/or combinational blocks that are interconnected to a memory unit 106 to receive memory data.

In embodiments, memory interface latch 104 can be useful in providing minimized memory access time, i.e., data transfer delay between memory unit 106 and processor/logic unit 108. Interface latch 104 can also allow IC test data to be placed onto the Q_N output of memory interface latch 104 without increasing the memory access time. Such minimized memory access time can be useful for managing IC clock cycle times and enhancing IC performance. The figures herein depict two embodiments of memory interface latch 104, however these are not limiting. Other types of memory interface latch 104, designed to minimize memory access time, while allowing the assertion of LBIST write-through data onto an output node may be possible.

In some embodiments, control signals 102 can include an LBIST control signal (LBIST), a fence control signal (FENCE) and a delayed clock (DEL_CLK) signal. The LBIST and FENCE control signals may be provided by an LBIST controller unit within the IC. The DEL_CLK signal may be provided by an IC clock distribution network/tree.

The LBIST and FENCE control signals may be used, in accordance with an LBIST test methodology and in conjunction with WRITE_DATA signal(s), to control data asserted onto one or more Q_N data outputs of memory interface latch 104. The "write-through" operation, as described, can be used to override data received from outputs of memory unit 106 with write data provided to inputs of memory unit 106.

Memory interface latch 104 includes inputs D1 and D2, connected to dynamic global bitlines of memory unit 106, and output Q_N connected to processor/logic unit 108. In an example memory read operation, an address may be provided to memory unit 106, and in response, at least one of the dynamic global bitlines connected to D1 and D2 may be pulled to a logic "0" level. In response to receiving a logic "0" level on input D1 or D2, memory interface latch 104, in a functional mode, then drives, on output Q_N, a complement of the received dynamic global bitline signal, synchronized with the DEL_CLK signal, to the processor/logic unit 108.

FIG. 1 depicts an example set of interconnections between memory unit, memory interface latch 104, processor/logic unit 108, associated control signals 102 and data signals. This depiction is included to provide an understanding of example uses of memory interface latch 104, but should not be construed as limiting. Other configurations, interconnect schemes, control and data signals between the various elements depicted may be possible. For ease of illustration, one data bit is depicted in the figurers; however, any number of data bits, e.g., 16, 32 or 64, in accordance with a particular size/dimensions of memory unit 102 may be used.

FIG. 2 is a schematic diagram depicting a memory interface latch with multiplexed LBIST write-through 200 that includes data NAND gate 208, feedback gate 212 and write-through mux 210, according to embodiments consistent with the figures. FIG. 2 can be useful in providing an understanding of the operation, benefits and drawbacks of such a multiplexed memory interface latch.

The depicted memory interface latch includes write-through mux 210 which allows memory write data to be placed onto the output Q_N. While the placement of such data onto the output Q_N can be useful in LBIST testing, the write-through mux 210 also causes the data path 220, from the bitline inputs D1 and D2 to the output Q_N, to be longer than necessary. Such extension of data path 220 can cause increased memory unit access times which can result in decreased overall IC clock frequency and performance.

Data NAND gate 208 includes FETS P1, P2, P3, N1, N2 and N3, inputs D1, D2 and FEEDBACK_NODE, and output DATA_OUT_N. Data NAND gate 208 is used to receive data from dynamic global bitlines of a memory element within a memory unit/array, e.g., 106, FIG. 1, and in response to those inputs and the FEEDBACK_NODE input, drive the DATA_OUT_N node with a corresponding output value.

Inputs D1 and D2 are connected to dynamic global bitlines from a memory element of a memory unit/array, e.g., 106, FIG. 1. The memory interface latch configuration depicted in FIG. 2 can be referred to as a 2-input "cross-coupled NAND" (XCNAND), referring to the two individual dynamic global dot lines connected to the inputs D1 and D2. When the memory unit or array, e.g., 106, FIG. 1, is reading a logic "0," either input D1 or D2 will be pulled to a logic "0," during the functional phase of the clock, when the LBIST input is a logic "0." If either input D1 or D2 is not pulled to a logic "0" it is held at a logic "1" by a keeper device within the memory array 106. Either D1 or D2 input that is pulled to a logic "0" will subsequently be precharged back to a logic "1" state during the precharge portion of the clock phase. If the memory array reads a logic "1" state then both D1 and D2 will be held to a logic "1" by their corresponding keeper devices within the memory array.

Feedback gate 212 includes FETS P4, P5, P6, N4, N5 and N6, FENCE, DEL_CLK and DATA_OUT_N inputs, and FEEDBACK_NODE output. Feedback gate 212 is used to, depending on its operational mode, either drive or latch the complement of the value on DATA_OUT_N onto FEEDBACK_NODE, or drive a logical "0" onto DATA_OUT_N.

In a functional mode, when the LBIST signal is a logic "0," the input DEL_CLK, which drives P4 and N4, serves as the clock signal within the feedback gate 212. During the functional phase of the clock, when the memory array is reading data, DEL_CLK transitions to a logic "0," turning on PFET P4 and allowing the inputs D1 and D2 to drive their corresponding data state onto the output Q_N, generally corresponding to the path depicted by data path 220.

At the end of the functional phase of the clock, DEL_CLK transitions back to a logic "1," prior to inputs D1 and D2 being precharged. The timing of the DEL_CLK transition back to a logic "1," captures, onto FEEDBACK_NODE, the state of Q_N through the FETs P5 and N6, generally corresponding to the path depicted by feedback path 226. Since D1 and D2 are both a logic "1" during the precharge phase of the clock, NFETs N2 and N1 are turned on, thus allowing the FEEDBACK_NODE to drive the Q_N value through FETs P3 and N3. As described above, the functional mode is dependent on LBIST being a logic "0." The above-described alternating phases of DEL_CLK, in conjunction with the latch receiving data from inputs D1 and D2 are used to synchronize data driven to output Q_N with DEL_CLK.

Write-through mux 210 includes inputs LBIST, WRITE_DATA and output Q_N, and is used to, depending on its operational mode, either drive the logical value on DATA_OUT_N onto Q_N or drive the logical value on WRITE_DATA onto Q_N. In an LBIST write-through mode, when the LBIST signal is a logic "1," the output signal Q_N will be driven by the WRITE_DATA input, as selected by write-through mux 210, and not by the data from input signals D1 and D2. This generally corresponds to the path depicted by write-through path 224. LBIST write-through mode can be useful for driving, in response to an LBIST controller, a known data value onto output Q_N, which may be, as discussed above, connected to a processor 108, FIG. 1. Such a known data value particularly useful in controlling inputs to a processor core, which can enable robust functional testing of the processor.

In a fence mode, when the FENCE signal is a logic "1," the output data, e.g., Q_N, of the array is forced to a logic "1." While a fence mode is not always included within memory array designs, it can be a useful testing mode. The fence mode is similar in operation to the LBIST write-through mode, however fence mode lacks the ability to drive the output to both logic "0" and logic "1" states. When the FENCE input is asserted to a logic "1," NFET N5 turns on, driving the FEEDBACK_NODE to a logic "0," generally corresponding to the paths depicted by fence path 222 and feedback path 226. The FEEDBACK_NODE being driven to a logic "0" turns on PFET P3, which then drives the output Q_N to a logic "1," generally corresponding to the path depicted by data path 220. The FENCE input remains at a logic "0" during functional mode, which turns on PFET P6, thus allowing the operations described above in reference to the functional and LBIST write-through modes to occur.

FIG. 3 is a schematic diagram depicting a memory interface latch with integrated LBIST write-through 304 that includes data NAND gate 308 and feedback gate 312, according to embodiments consistent with the figures. FIG. 3 can be useful in providing an understanding of the operation and benefits of a memory interface latch with integrated LBIST write-through, and the structural and functional differences between latch 304 and latch 200, FIG. 2.

Data NAND gate 308 includes FETS P1, P2, P3, N1, N2 and N3, inputs D1, D2 and FEEDBACK_NODE, and output Q_N. Data NAND gate 308 is consistent with data NAND gate 208, FIG. 2 in both circuit topology and function. In comparison to memory interface latch 200, FIG. 2, FETS P7, N7, and logic gate NOR1 were added to the design depicted in FIG. 3, FETS N5 and P6 were re-purposed, and the write-through mux 210, FIG. 2 was removed. The input signals FENCE and LBIST were removed and the input signal LBIST_N, a complement of LBIST, was added to the circuit, as depicted in FIG. 3.

FIG. 3 depicts data NAND gate 308 as a 3-input NAND gate, however in some embodiments requiring only one dynamic global bitline, e.g., D1, to be read from a memory array, data NAND gate 308 may be a 2-input NAND gate. In some embodiments, data NAND gate 308 may have some other number of inputs corresponding to a particular memory array architecture or number of bitlines to be read. It is also contemplated that in accordance with memory array architectures and signal polarities, other types of logic gates, e.g., NOR gates, may be substituted for NAND gate 308.

The base functionality of latch 304 during the functional and precharge phases of the memory array clock remains the same as the previously described functionality of latch 200, FIG. 2. The only operational difference between memory interface latches 200 and 304 is that for latch 304, instead of input signal FENCE being held at a logic "0" during a functional mode, input signal LBIST_N is held at a logic "1." When the LBIST_N signal is a logic "1" NFET N5 is turned on and the output of logic gate NOR1 is a logic "0," turning on PFET P6 and turning off NFET N7. Under these conditions, all of the logical operations described above in reference to memory interface latch 200, FIG. 2 remain the same for memory interface latch 304, FIG. 3.

The difference in the function of the feedback gate 312, FIG. 3 compared to that depicted in FIG. 2 is that when the memory interface latch 304 is in an LBIST write-through mode, LBIST_N is asserted to a logic "0," causing PFET P7 to turn on, NFET N5 to turn off, and logic gate NOR1 to drive the complement value of the WRITE_DATA input signal onto the PFET P6 and P7 gates. When the memory interface latch 304 is in an LBIST write-through mode, input signals D1 and D2 are actively held at the precharge or logic "1" state by the memory array, thus turning on NFETs N1 and N2 while turning off PFETs P1 and P2. With NFETs N1 and N2 turned on, the output Q_N is then driven by the FEEDBACK_NODE. Input signal DEL_CLK is also held to a logic "1" when the memory interface latch 304 is in an LBIST write-through mode.

The logical value of the FEEDBACK_NODE is set by PFETs P6 and N7 which are driven by the output of logic gate NOR1. When LBIST_N is a logic "0" the WRITE_DATA input to logic gate NOR1 is driven onto the Q_N output through FETs P6, P7, N7, N3, or P3 through the FEEDBACK_NODE. Once the output signal Q_N is updated, its value remains latched on the Q_N output through the latching of the FEEDBACK_NODE. By driving the Q_N output through the FEEDBACK_NODE and not through the write-through mux, e.g., 210, FIG. 2, the array access time can be reduced by approximately 1-2 logic gate delays, i.e., the delay of the write-through mux, e.g., 210, FIG. 2.

The feedback gate 312 depicted in FIG. 3 does not include the fence function as the value of Q_N can be set to either a logic "0" or a logic "1" state through the WRITE_DATA input signal which eliminates the need for a forced logic "1," i.e., fence, test mode. In order to accomplish the fence operation previously described in reference to FIG. 2, LBIST_N can be asserted to a logic "1" and WRITE_DATA can be asserted to a logic "0."

Data path 320, feedback path 326 and write-through path 324 are included in FIG. 3 to provide generalized visual indicators of signal propagation paths through the memory interface latch 304. It may be noted that data path 320 includes one gate delay, whereas the comparable data path 224 for memory interface latch 200 including a write-through mux, includes approximately 2-3 gate delays.

Figure 4:
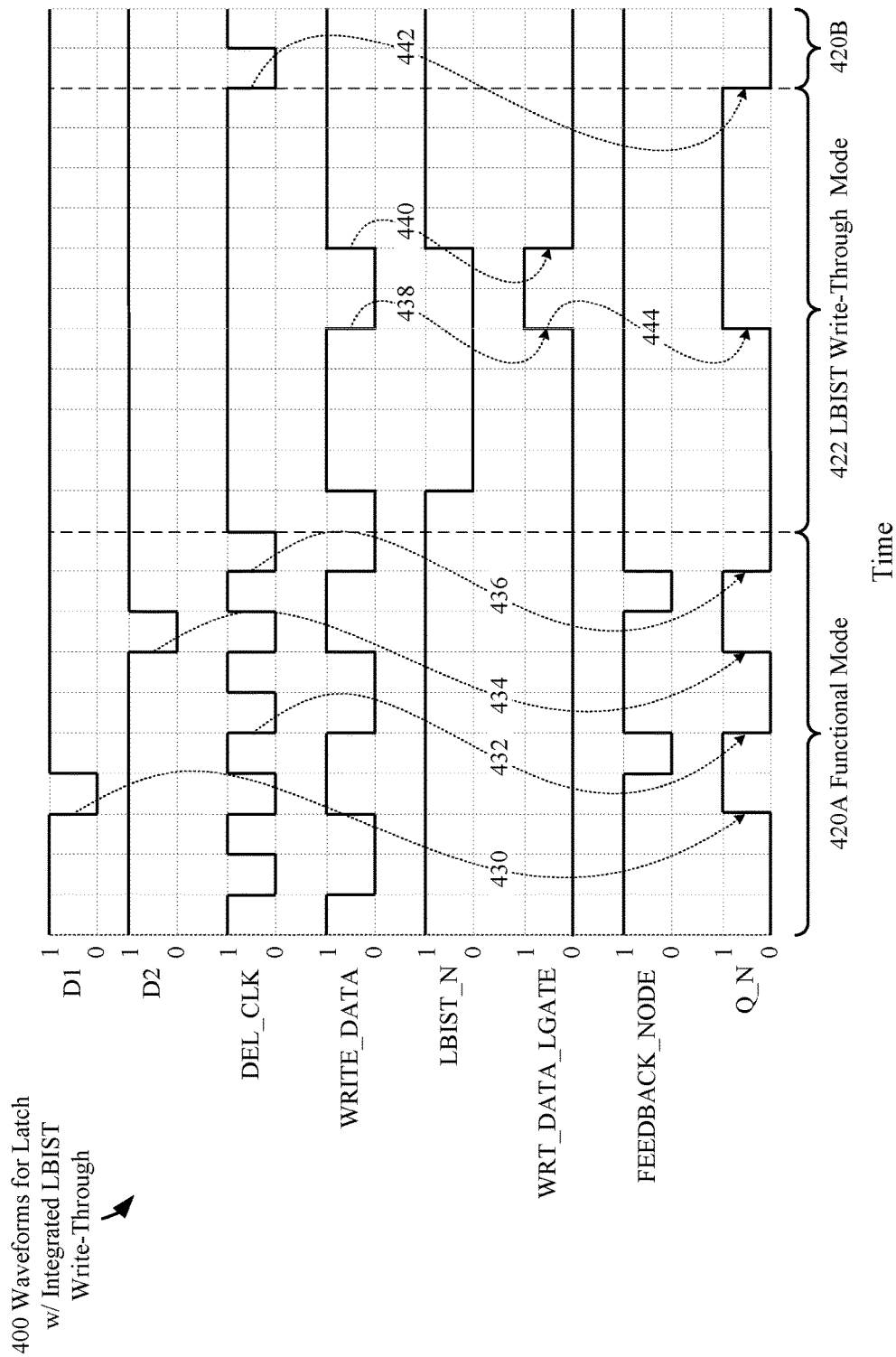
FIG. 4 is a waveform diagram for a memory interface latch with integrated LBIST write-through, according to embodiments consistent with the figures.

FIG. 4 is a waveform diagram 400 including a set of waveforms for a memory interface latch with integrated LBIST write-through, according to embodiments consistent with the figures, particularly FIG. 3. The waveforms included in FIG. 4 are useful in providing a visual understanding of the timing relationships of signals included in various circuit operations and operating modes described above in reference to the memory interface latch 304, FIG. 3. The signal names listed in waveform diagram 400, e.g., "D1," represent names of corresponding nodes depicted in FIG. 3.

Waveform diagram 400 is divided, along the Time axis, into three time intervals: functional mode 420A, LBIST write-through mode 422 and functional mode 420B. Each of these intervals depicts signal transitions and causal relationships for respective operating modes of memory interface latch 304, FIG. 3.

The functional mode 420A time interval includes a memory array read of a logic "0" and logic "1" for both inputs D1 and D2, while the memory interface latch is in a functional mode. Transition 430 indicates the falling edge of input signal D1 causing output Q_N to subsequently rise, followed by a subsequent rising edge of DEL_CLK, which latches the logic "0" value of D1. The value of D1 is latched until the subsequent transition 432, which then allows output Q_N to be driven to a logic "1," in response to both D1 and D2 inputs being at logic "1" states. A similar pair of write operations corresponding to input signal D2 and performed, as denoted by transitions 434 and 436.

The LBIST write-through mode 422 time interval subsequently includes a write of a logic "0" and logic "1" to the memory interface latch 304, as indicated by transitions 438, 440 and 444. The WRITE_DATA_LGATE signal is the output of device NOR1, FIG. 3.

It can be noted that in a functional mode, during the functional phase of the clock, i.e., when DEL_CLK is a logic "0," the complement of inputs D1 and D2 is driven onto output Q_N. When signal LBIST_ N transitions to a logic "0" the signal WRITE_DATA_LGATE signal is driven by logic gate NOR1, FIG. 3, to the complement of the WRITE_DATA input signal instead being driven to a logic "0," as it was when LBIST_N was a logic "1." The WRITE_DATA input signal then driven onto the FEEDBACK_NODE and then its complement is driven onto Q_N. Time interval 420B includes transition 442, corresponding to a return to a functional mode, and the capture and subsequent propagation of the complement of D1 and D2 logic "1" data values to output Q_N.

FIG. 5 is a schematic diagram depicting a memory interface latch with integrated LBIST write-through and internal fence capability that includes data NAND gate 508, feedback gate 512, and transistor stack 514, according to embodiments consistent with the figures. FIG. 5 can be useful in providing an understanding of the operation and benefits of memory interface latch with integrated LBIST write-through and internal fence capability, and the structural and functional differences between latch 504 and latch 200, FIG. 2.

Memory interface latch 504 includes FETs P1, P2, P3, P4, P5, N1, N2, N3, N4, and N6, all having the same interconnections as depicted with respect to memory interface latch 200, FIG. 2. FETs P6 and N5 are still in the same configuration as they were within memory interface latch 200, but in latch 504 are driven by the signal FENCE_LBIST_COMBINE. The FENCE_LBIST_COMBINE is driven to a logic "1" through logic gate OR1 when latch 504 is in a FENCE or LBIST write-through mode. FETS P7, P8, N7, and N8, logic gate NAND1 and input signal LBIST_WRT_THRU have been added to latch 504 in order to perform an LBIST write-through separately from a fence operation. When performing a standard memory read operation in functional mode the function of memory interface latch 504 is consistent with that of to memory interface latch 200, FIG. 2.

FIG. 5 depicts data NAND gate 508 as a 4-input NAND gate, however in some embodiments requiring only one dynamic global bitline, e.g., D1, to be read from a memory array, data NAND gate 508 may be a 3-input NAND gate. In some embodiments, data NAND gate 508 may have some other number of inputs corresponding to a particular memory array architecture or number of bitlines to be read. It is also contemplated that in accordance with memory array architectures and signal polarities, other types of logic gates, e.g., NOR gates, may be substituted for NAND gate 508.

The difference in the functionality of latch 504 relative to the functionality of latch 200 occurs when either of the input signals FENCE or LBIST_WRT_THRU are asserted to a logic "1." If the FENCE signal is asserted to a logic "1" the internal signal FENCE_LBIST_COMBINE is also driven to a logic "1," through logic gate OR1, subsequently turning on FETs N5 and P3 while turning off FETs P6 and N3.

When the FENCE signal is asserted to a logic "1," input signal LBIST_WRT_THRU would be at a logic "0" state, leaving PFET P7 turned on, and D1 and D2 would be at a precharge, i.e., logic "1" state, thereby turning off PFETs P1 and P2 while turning on NFETs N1 and N2. When the FENCE signal is asserted to a logic "1," input signal DEL_CLK will also be a logic "1," thus turning on NFET N4 and turning off PFET P4. When all of these conditions have been meet the FENCE signal transitioning to a logic "1" drives a logic "0" onto the FEEDBACK_NODE through NFET N5 and then drives a logic "1" onto output signal Q_N through PFET P3.

When latch 504 is in an LBIST write-through mode, the FENCE signal is at a logic "0" and LBIST_WRT_THRU is asserted to a logic "1," thereby turning off PFET P7 and turning on NFET N7. This allows the NAND1 gate to be driven by the WRITE_DATA input. The internal signal FENCE_LBIST_COMBINE will be driven to a logic "1" by logic gate OR1, thereby turning off PFET P6 and turning on NFET N5. With NFET N5 on the FEEDBACK_NODE is driven to a logic "0," which turns off NFET N3 and turns on PFET P3. With PFET P3 on and FETs P7 and N3 off there is no path to either VDD or ground to be connected to output signal Q_N except through the FET stack 514. In an LBIST write-through mode, inputs D1 and D2 are again in the precharge state with DEL_CLK at a logic "1." The internal signal WRT_DATA_LGATE is then driven to the top of the logic value of input WRITE_DATA by logic gate NAND1 which then drives the output signal Q_N to the logic value of the WRITE_DATA input, through FETs P8 and N8.

After the LBIST write-through operation is complete, the input signal LBIST_WRT_THRU is then asserted to a logic "0," thus turning on FETs P7 and N7. LBIST_WRT_THRU being asserted to a logic "0" also forces the internal signal WRT_DATA_LGATE to a logic "0" through logic gate NAND1, which then turns on NFET N8 and turns off PFET P8. Internal signal FENCE_LBIST_COMBINE is driven to a logic "0" through logic gate OR1, as the FENCE input is asserted to a logic "0" state. The Q_N is therefore held at the logic state of input signal WRITE_DATA when the LBIST write-through occurred, until the array returns back to a functional mode.

Data path 520, feedback path 526 and write-through path 524 are included in FIG. 5 to provide generalized visual indicators of signal propagation paths through the memory interface latch 504. It may be noted that data path 520 includes one gate delay, whereas the comparable data path 224 for memory interface latch 200 including a write-through mux, includes approximately 2-3 gate delays.

Figure 6:
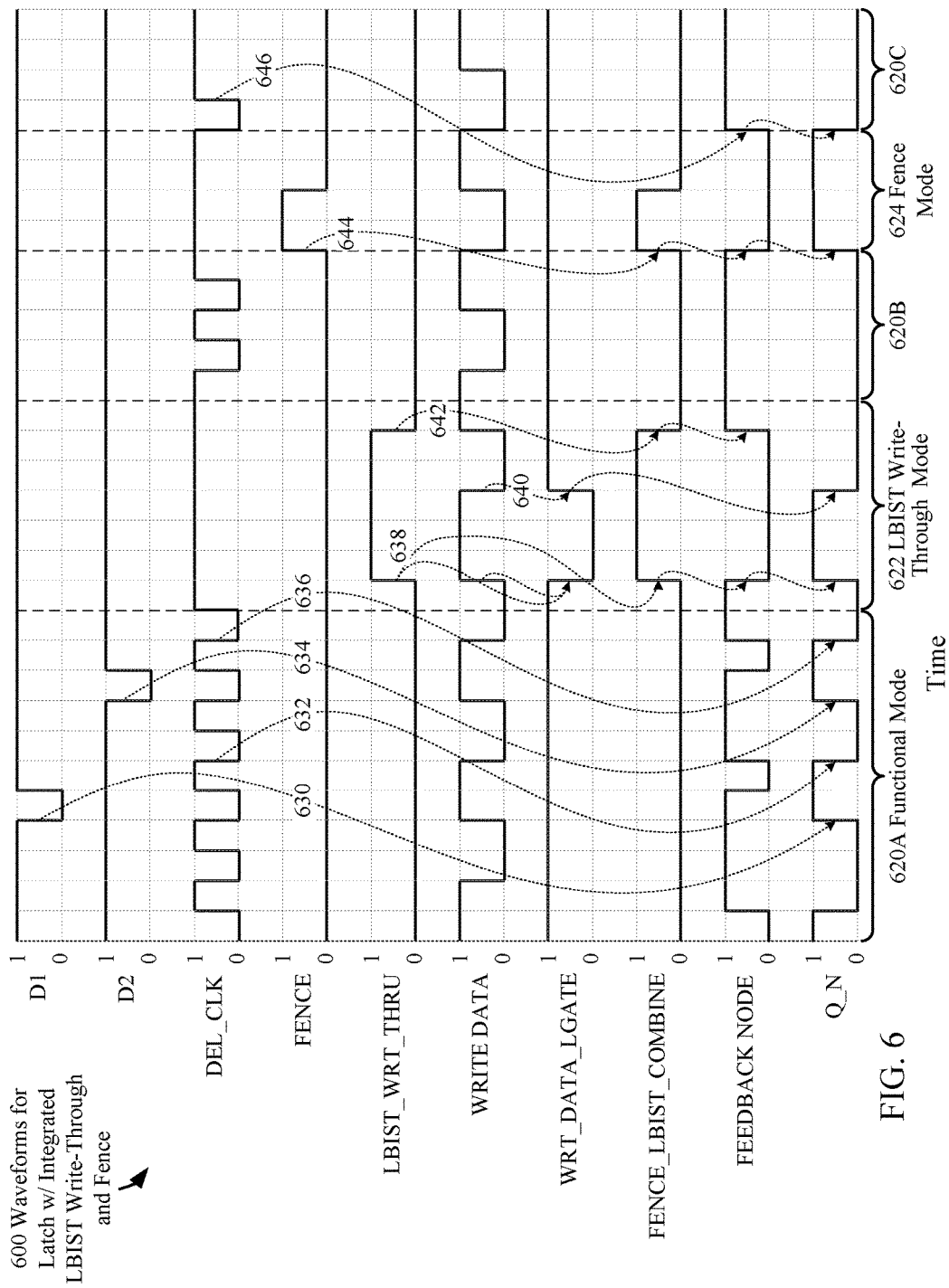
FIG. 6 is a waveform diagram for a memory interface latch with integrated LBIST write-through and internal fence, according to embodiments consistent with the figures.

FIG. 6 is a waveform diagram 600 including a set of waveforms for a memory interface latch with integrated LBIST write-through and internal fence, according to embodiments consistent with the figures, particularly FIG. 5. The waveforms included in FIG. 6 are useful in providing a visual understanding of the timing relationships of signals included in various circuit operations and operating modes described above in reference to the memory interface latch 504, FIG. 5. The signal names listed in waveform diagram 600, e.g., "D1," represent names of corresponding nodes depicted in FIG. 5.

Waveform diagram 600 is divided, along the Time axis, into five time intervals: functional mode 620A, LBIST write-through mode 622, functional mode 620B, fence mode 624 and functional mode 620C. Each of these intervals depicts signal transitions and causal relationships for respective operating modes of memory interface latch 504, FIG. 5.

The functional mode 620A time interval includes a memory array read of a logic "0" and logic "1" for both inputs D1 and D2, while the memory interface latch is in a functional mode. Transition 630 indicates the falling edge of input signal D1 causing output Q_N to subsequently rise, followed by a rising edge of DEL_CLK, which latches the logic "0" value of D1. The value of D1 is latched until the transition 632, which then allows output Q_N to be driven to a logic "1," in response to both D1 and D2 inputs being at logic "1" states. A similar pair of write operations corresponding to input signal D2 and performed, as denoted by transitions 634 and 636.

The LBIST write-through mode 622 time interval includes a write of a logic "0" and logic "1" to the memory interface latch 504, as indicated by transitions 638, 640 and 642. A fence operation is performed during fence mode interval 624, as indicated by transition 644, followed by a read of a logic "1," as indicated by transition 646, during functional mode interval 620C.

When the memory interface latch 504 is in a functional mode, during the functional phase of the clock, i.e., when DEL_CLK is a logic "0," the complement of inputs D1 and D2 is driven onto output Q_N. When signal LBIST_WRT_THRU transitions to a logic "1," the FENCE_LBIST_COMBINE signal is driven to a logic "1" while the WRITE_DATA_LGATE signal is driven to the complement of input signal WRITE_DATA instead of the logic "1" state it was in when LBIST_WRT_THRU was a logic "0." This value is then driven onto the Q_N output through the stack 514, as described in reference to FIG. 5. When the memory interface latch 504 is put into fence mode the input signal FENCE_LBIST_COMBINE is forced to a logic "1" and memory interface latch 504 outputs a logic "1" on the Q_N output signal.

It can be understood that the association of the logical "0" and "1" states of the DEL_CLK signal with certain behaviors of a memory interface latch have been discussed above by way of example, and is not limiting. In some embodiments, the discussed behaviors may be associated with complimentary logical states of the DEL_CLK signal from those detailed above. It can be similarly understood that the assertion of certain logical states/polarities of data, e.g., write data or fixed logic values in response to FENCE signal assertions onto the FEEDBACK_NODE and Q_N output are discussed by way of example, and are not limiting. In some embodiments, complimentary polarities of write data and/or fixed logic values in response to FENCE signal assertions may be asserted.

Figure 7:
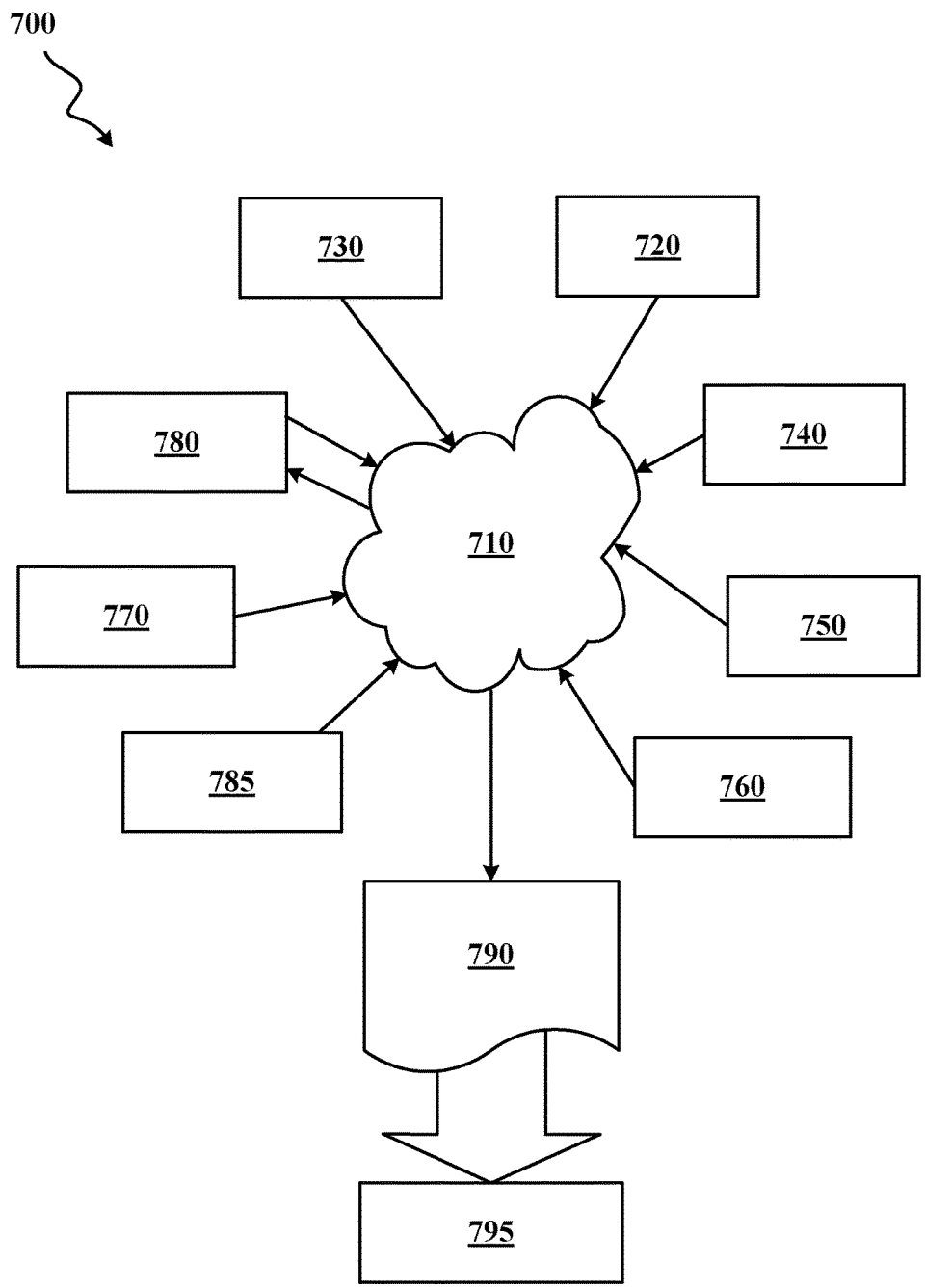
FIG. 7 illustrates multiple design structures including an input design structure that is preferably processed by a design process.

FIG. 7 depicts multiple design structures 700 including an input design structure 720 that is preferably processed by a design process, according to embodiments consistent with the figures. Design structure 720 may be a logical simulation design structure generated and processed by design process 710 to produce a logically equivalent functional representation of a hardware device. Design structure 720 may alternatively include data or program instructions that, when processed by design process 710, generate a functional representation of the physical structure of a hardware device. Whether representing functional or structural design features, design structure 720 may be generated using electronic computer-aided design, such as that implemented by a core developer/designer. When encoded on a machine-readable data transmission, gate array, or storage medium, design structure 720 may be accessed and processed by one or more hardware or software modules within design process 710 to simulate or otherwise functionally represent an electronic component, circuit, electronic or logic module, apparatus, device, or system such as those depicted in FIG. 1-6. As such, design structure 720 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 710 preferably employs and incorporates hardware or software modules for synthesizing, translating, or otherwise processing a design/simulation functional equivalent of the components, circuits, devices, or logic structures depicted in FIG. 1-6, to generate a Netlist 760 which may contain design structures such as design structure 720. Netlist 760 may comprise, for example, compiled or otherwise processed data structures representing a list of wires, discrete components, logic gates, control circuits, I/O devices, models, etc. that describe the connections to other elements and circuits in an integrated circuit design. Netlist 760 may be synthesized using an iterative process in which Netlist 760 is resynthesized one or more times depending on design specifications and parameters for the device. As with other design structure types described herein, Netlist 760 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 710 may include hardware and software modules for processing a variety of input data structure types including Netlist 760. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 765 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710, without deviating from the scope and spirit of the disclosure. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures, along with any additional mechanical design or data, to generate a second design structure 790. Design structure 790 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1-6. In one embodiment, design structure 790 may comprise a compiled, executable HDL simulation model that functionally simulates the devices depicted in FIG. 1-6.

Design structure 790 may also employ a data format used for the exchange of layout data of integrated circuits and/or symbolic data format (e.g., information stored in a GDSII, GL1, OASIS, map files, or any other suitable format for storing such design data structures). Design structure 790 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1-6. Design structure 790 may then proceed to a state 795 where, for example, design structure 790 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A memory interface latch within an integrated circuit (IC) that includes a memory array, the memory interface latch comprising:
   a data NAND gate configured to drive, in response to at least one input selected from the group consisting of: a bitline of the memory array and a feedback node being driven to a stored data value, a data complement (Q_N) output of the memory interface latch to an output value corresponding to the stored data value within a time interval of one gate delay; and
   a feedback gate coupled to the Q_N output and to the feedback node, the feedback gate configured to:
      in a functional mode initiated by receiving a de-asserted logic built-in self-test (LBIST) input signal:
         in response to a clock input signal of a first clock input state, drive the feedback node to a logic "1"; and in response to a clock input signal that is a complement of the first clock input state, drive the feedback node to a complement of a logic state of the Q_N output; and in a write-through mode initiated by receiving an asserted LBIST input signal, drive the feedback node to a logic state corresponding to a logic state of a WRITE_DATA input signal.

2. The memory interface latch of claim 1, wherein the data NAND gate is further configured to drive the Q_N output to an output value that is a complement of the stored data value.

3. The memory interface latch of claim 1, wherein the data NAND gate is a 2-input NAND gate having a first input coupled to the bitline of the memory array and a second input coupled to the feedback node.

4. The memory interface latch of claim 1, wherein the data NAND gate is a 3-input NAND gate having a first input coupled to the bitline of the memory array, a second input coupled to an additional bitline of the memory array, and a third input coupled to the feedback node, the data NAND gate further configured to drive, in response to at least one input selected from the group of inputs consisting of: the first input, the second input, and the third input being driven to a stored data value, the data complement (Q_N) output of the memory interface latch to an output value corresponding to the stored data value within the time interval of one gate delay.

5. The memory interface latch of claim 1, further comprising a clock input configured to receive a clock input signal from a clock distribution network within the IC.

6. The memory interface latch of claim 1, further comprising a WRITE_DATA input coupled to a write data input of the memory array, the WRITE_DATA input configured to receive the WRITE_DATA input signal.

7. The memory interface latch of claim 1, wherein the Q_N output of the memory interface latch is coupled to a data input of a processor unit within the IC.

8. The memory interface latch of claim 1, further comprising an LBIST input configured to receive the LBIST input signal from an LBIST controller within the IC.

9. A memory interface latch within an integrated circuit (IC) that includes a memory array, the memory interface latch configured to drive, to a data complement (Q_N) output coupled to a processor circuit, through a data path that includes one gate delay, the complement of a data signal received from an active bitline of the memory array, the memory interface latch comprising:

a logic circuit having a first input coupled to the active bitline of the memory array and an output coupled to the Q_N output; and a feedback circuit coupled to a second input of the logic circuit through a feedback node, the feedback circuit further coupled to the output of the logic circuit at the Q_N output.

10. The memory interface latch of claim 9, further configured to, in response to a built-in self-test (LBIST) signal received by the feedback circuit, block the driving of the complement of the received data signal onto the Q_N output by driving the Q_N output with a WRITE_DATA input signal value received by the feedback circuit.

11. The memory interface latch of claim 9, further comprising an LBIST input configured to receive the LBIST input signal from an LBIST controller within the IC.

12. The memory interface latch of claim 9, further comprising a WRITE_DATA input coupled to a write data input of the memory array, the WRITE_DATA input configured to receive the WRITE_DATA input signal.

13. The memory interface latch of claim 9, wherein the Q_N output is coupled to a data input of a processor unit within the IC.

14. The memory interface latch of claim 9, wherein the logic circuit is a 2-input NAND gate, a first input of the 2-input NAND gate coupled to the active bitline of the memory array and a second input of the 2-input NAND gate coupled to the feedback node.

15. The memory interface latch of claim 9, wherein the logic circuit is a 3-input NAND gate, a first input of the 3-input NAND gate coupled to the active bitline of the memory array, a second input of the 3-input NAND gate coupled to an idle bitline of the memory array, and a third input of the 3-input NAND gate coupled to the feedback node, wherein the logic state of the idle bitline allows the logic circuit to drive, to the Q_N output, the complement of the data signal received from the active bitline of the memory array.

16. The memory interface latch of claim 9, wherein the feedback circuit includes a clock input, the feedback circuit configured to synchronize, with a clock signal received on the clock input, the driving to the processor circuit, of the complement of the data signal received from the active bitline of the memory array.

17. The memory interface latch of claim 16, further comprising a clock input coupled to a clock distribution network within the IC, the clock input configured to received the clock input signal from the clock distribution network.

18. A design structure embodied on a non-transitory computer-readable storage medium readable by a machine used in design, manufacture, and simulation of an integrated circuit (IC) that includes a memory array and a memory interface latch, the design structure comprising elements that, when processed in a semiconductor manufacturing facility, produce an IC comprising:

a logic circuit having a first input coupled to the active bitline of the memory array and an output coupled to the Q_N output; and a feedback circuit coupled to a second input of the logic circuit through a feedback node, the feedback circuit further coupled to the output of the logic circuit at the Q_N output.

* * * * *